United States Patent
Ishimura

(10) Patent No.: US 7,851,823 B2
(45) Date of Patent: Dec. 14, 2010

(54) SEMICONDUCTOR PHOTODETECTOR DEVICE

(75) Inventor: Eitaro Ishimura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 345 days.

(21) Appl. No.: 12/098,543

(22) Filed: Apr. 7, 2008

(65) Prior Publication Data
US 2008/0191241 A1 Aug. 14, 2008

Related U.S. Application Data

(62) Division of application No. 11/282,730, filed on Nov. 21, 2005, now abandoned.

(30) Foreign Application Priority Data
Mar. 14, 2005 (JP) .................... 2005-070646

(51) Int. Cl.
*H01L 31/107* (2006.01)
(52) U.S. Cl. ............ 257/186; 257/199; 257/438; 257/481; 257/603; 257/E31.064; 257/E31.116; 257/E29.335; 257/E21.357; 438/91; 438/380
(58) Field of Classification Search ............... None
See application file for complete search history.

(56) References Cited

U.S. PATENT DOCUMENTS

| | | | |
|---|---|---|---|
| 5,406,097 A * | 4/1995 | Kusakabe | 257/186 |
| 6,396,117 B1 | 5/2002 | Furukawa et al. | |
| 6,894,322 B2 | 5/2005 | Kwan et al. | |
| 2002/0005524 A1 | 1/2002 | Kato et al. | |
| 2003/0178636 A1 | 9/2003 | Kwan et al. | |
| 2004/0251483 A1 * | 12/2004 | Ko et al. | 257/292 |
| 2005/0194654 A1 | 9/2005 | Iguchi | |

FOREIGN PATENT DOCUMENTS

| JP | 2000-077702 | 3/2000 |
|---|---|---|
| JP | 2002-033503 | 1/2002 |

OTHER PUBLICATIONS

Kazuhito Yasuda et al., "Heterojunction Effect on Spectral and Frequency Responses in InP/InGaAsP/InGaAs APD", *Japanese J. of Applied Physics*, vol. 22 (1983) Supplemental 22-1, pp. 291-294.

* cited by examiner

*Primary Examiner*—Steven Loke
*Assistant Examiner*—Hoang-Quan T Ho
(74) *Attorney, Agent, or Firm*—Leydig, Voit & Mayer, Ltd.

(57) ABSTRACT

A transmitted light absorption/recombination layer, a barrier layer, a wavelength selection/absorption layer, and an InP window layer having a p-type region are supported by an n-type substrate and arranged in that order. Light with a wavelength of 1.3 μm reaches the wavelength selection/absorption layer through the InP window layer. Then, the light is absorbed by the wavelength selection/absorption layer and drawn from the device as an electric current signal. Light with a wavelength of 1.55 μm reaches the transmitted light absorption/recombination layer through the barrier layer. Then, the light is absorbed by the transmitted light absorption/recombination layer, generating electrons and holes. These electrons and holes recombine with each other and, hence, disappear.

4 Claims, 13 Drawing Sheets light

*Prior Art* light

*Prior Art*

US 7,851,823 B2

SEMICONDUCTOR PHOTODETECTOR DEVICE

BACKGROUND OF THE INVENTION

1. Field of the Invention

The present invention relates to semiconductor photodetector devices such as photodiodes and avalanche photodiodes.

2. Background Art

In a multiple-wavelength optical communications system, the optical receivers must have a function to selectively receive light having a desired wavelength.

FIG. 11 is a diagram showing the configuration of a conventional optical receiver. In the figure, two wavelengths of light, 1.3 μm and 1.55 μm, are incident on the optical receiver, but the avalanche photodiode 161 receives only the 1.3 μm wavelength light. Specifically, a wavelength filter 163 for reflecting 1.55 μm wavelength light 162 is provided in front of the avalanche photodiode 161, acting as a photodetector device, to selectively receive 1.3 μm wavelength light 164.

FIG. 12 is a cross-sectional view of a conventional avalanche photodiode (hereinafter referred to as a "conventional APD") for optical communications. Referring to the figure, reference numeral 171 denotes an anode electrode; 172 denotes a p-type diffusion layer region; 173, a nonreflective film; 174, an undoped InP window layer; 175, an n-type InP electric field reduction layer; 176, an undoped InGaAsP graded layer; 177, an undoped InGaAs light absorption layer; 178, an n-type InP substrate; 179, a cathode electrode; 180, an anode electrode; 181, a multiplication region; and 182, a guard ring region.

The nonreflective film 173 and the InP window layer 174 also act as a surface protective film and a multiplication layer, respectively. It should be noted that the InP window layer 174 has a large bandgap and hence does not absorb the wavelengths used in typical optical communications, such as 1.3 μm and 1.55 μm, allowing these wavelengths to pass without change. The guard ring region 181 is provided to prevent edge multiplication and is a p-type region having a low carrier concentration.

Light entering the nonreflective film 173, as shown at the top of the FIG. 12, is passed through the InP window layer 174 and then absorbed by the InGaAs light absorption layer 177, generating electrons and holes. It should be noted that the avalanche photodiode (APD) is reverse-biased with a high voltage (approximately 25 V), which depletes the InGaAs light absorption layer 177, the InGaAsP graded layer 176, the n-type InP electric field reduction layer 175, and the multiplication region 181. Therefore, the generated electrons flow toward the n-type InP substrate 178 through the depleted layers. On the other hand, the holes flow toward the multiplication region 181 having a high electric field applied thereto. The holes that have reached the multiplication region 181 causes avalanche multiplication, generating a large number of new electrons and holes. As a result, the light signal that has entered the APD is drawn from it as a multiplied electric current signal. The magnitude of the obtained electric current signal is ten-odd times larger than when no multiplication occurs.

Further, there is a conventional semiconductor photodetector device which, upon reception of two different wavelengths of light, photoelectrically converts only the longer wavelength light and outputs the resultant signal (see, e.g., Japanese Patent Laid-Open No. 2000-77702). That is, this semiconductor photodetector device has sensitivity to only the longer wavelength light.

FIG. 13 is a cross-sectional view of this semiconductor photodetector device. Referring to the figure, reference numeral 191 denotes an n⁻-type InGaAs second absorption layer; 192, an n-type InP buffer layer; 193, an InGaAsP first absorption layer; 193a, a p-type InGaAsP region; 193b, an n⁻-type InGaAsP region; 194, an n-type InP substrate; 195, an antireflective film; 196, a p-type diffusion layer region; and 197, a nonreflective film.

The following description assumes that 1.3 μm wavelength light and 1.55 μm wavelength light are incident on the photodetector device shown in FIG. 13. In the photodetector device, the 1.55 μm wavelength light, whose wavelength is longer than the bandgap wavelength of the InGaAsP first absorption layer 193, reaches the n⁻-type InGaAsP second absorption layer 191 and then is drawn from the device as a photocurrent. On the other hand, the 1.3 μm wavelength light, whose wavelength is shorter than the bandgap wavelength of the InGaAsP first absorption layer 193, is absorbed by the InGaAsP first absorption layer 193. In this case, since no electric field is applied to the InGaAsP first absorption layer 193, the generated carriers recombine with each other. Therefore, this shorter wavelength light is not drawn from the device as a photocurrent.

Further, there is a conventional technique in which a reflective film for reflecting the shorter wavelength light is formed to receive only the longer wavelength light and convert it into a photocurrent (see, e.g., Japanese Patent Laid-Open No. 2002-33503). This photodetector device also has sensitivity to only the longer wavelength light.

Incidentally, recent multiple-wavelength optical communications systems require optical receivers having a very high wavelength selectivity ratio as much as 1000:1, or 30 dB, for 1.3 μm and 1.55 μm wavelengths. This means that these optical receivers must have high sensitivity to 1.3 μm wavelength light but substantially no sensitivity to 1.55 μm wavelength light.

However, to achieve such a high selectivity ratio, conventional APDs must be provided with a wavelength filter, as described below.

Referring to FIG. 12, the bandgap wavelength of the InGaAs light absorption layer 177 is 1.67 μm, and that of the InP window layer 174 is 0.92 μm. Therefore, this APD has high sensitivity to a wide range of wavelengths, from 0.92 μm to 1.67 μm, which means that the APD has approximately the same sensitivity to 1.3 μm and 1.55 μm wavelengths. As a result, the APD cannot receive the shorter wavelength 1.3 μm without receiving the longer wavelength 1.55 μm unless it is provided with a wavelength filter.

Further, as described above, although photodetector devices for selectively receiving the longer wavelength light have been available, there is no known photodetector device capable of selectively receiving the shorter wavelength light.

SUMMARY OF THE INVENTION

The present invention has been devised in view of the above problems. It is, therefore, an object of the present invention to provide a semiconductor photodetector device having a high wavelength selectivity ratio without using a wavelength filter.

Another object of the present invention is provide a semiconductor photodetector device capable of selectively receiving the shorter wavelength light.

According to one aspect of the present invention, a semiconductor photodetector device comprises a first semiconductor layer of a first conductive type, a first absorption layer, and a second semiconductor layer having a larger bandgap than the first absorption layer. The first semiconductor layer, the first absorption layer, and the second semiconductor layer are formed from bottom to top in that order so as to form a laminated structure. The semiconductor photodetector device is adapted to receive light incident on the second semiconductor layer side. The second semiconductor layer includes an impurity region of a second conductive type. The semiconductor photodetector device further comprises a second absorption layer formed between the first semiconductor layer and the first absorption layer. The second absorption layer has a smaller bandgap than the first absorption layer.

According to another aspect of the present invention, a semiconductor photodetector device comprises a first semiconductor layer of a first conductive type, a first absorption layer, and a second semiconductor layer having a larger bandgap than the first absorption layer. The first semiconductor layer, the first absorption layer, and the second semiconductor layer are formed from bottom to top in that order so as to form a laminated structure. The semiconductor photodetector device is adapted to receive light incident on the first semiconductor layer side. The second semiconductor layer includes an impurity region of a second conductive type. The semiconductor photodetector device further comprises a second absorption layer formed between the second semiconductor layer and the first absorption layer or formed on the second semiconductor layer. The second absorption layer has a smaller bandgap than the first absorption layer.

According to other aspect of the present invention, a semiconductor photodetector device comprises a first semiconductor layer of a first conductive type, a first absorption layer, and a second semiconductor layer having a larger bandgap than the first absorption layer. The first semiconductor layer, the first absorption layer, and the second semiconductor layer are formed from bottom to top in that order so as to form a laminated structure. The semiconductor photodetector device is adapted to receive light incident on the second semiconductor layer side. The second semiconductor layer includes an impurity region of a second conductive type. The semiconductor photodetector device further comprises a second absorption layer formed on the second semiconductor layer. The second absorption layer has a bandgap that is larger than the bandgap of the first absorption layer but smaller than the bandgap of the second semiconductor layer. A third absorption layer is formed between the first semiconductor layer and the first absorption layer. The third absorption layer has a smaller bandgap than the first absorption layer.

According to other aspect of the present invention, a semiconductor photodetector device comprises a first semiconductor layer of a first conductive type, a first absorption layer, and a second semiconductor layer having a larger bandgap than the first absorption layer. The first semiconductor layer, the first absorption layer, and the second semiconductor layer are formed from bottom to top in that order so as to form a laminated structure. The semiconductor photodetector device is adapted to receive light incident on the first semiconductor layer side. The second semiconductor layer includes an impurity region of a second conductive type. The semiconductor photodetector device further comprises a second absorption layer formed on the second semiconductor layer, the second absorption layer having a smaller bandgap than the first absorption layer, and a third absorption layer formed between the first semiconductor layer and the first absorption layer. The third absorption layer has a larger bandgap than the first absorption layer.

Other objects and advantages of the present invention will become apparent from the following description.

DETAILED DESCRIPTION OF THE PREFERRED EMBODIMENTS

Preferred embodiments of the present invention will be described with reference to the accompanying drawings.

First Embodiment

A semiconductor photodetector device of a first embodiment of the present invention includes a laminated structure made up of a semiconductor layer of a first conductive type, a first absorption layer, and a window layer formed from bottom to top in that order, and light enters the device from the window layer side. The window layer includes an impurity region of a second conductive type, and a second absorption layer having a smaller bandgap than the first absorption layer is provided on the "semiconductor layer of the first conductive type" side of the first absorption layer. Specifically, the second absorption layer may be provided between the semiconductor layer of the first conductive type and the first absorption layer.

According to the present embodiment, the semiconductor layer of the first conductive type corresponds to an n-type InP substrate; the first absorption layer corresponds to a wavelength selection/absorption layer; and the second absorption layer corresponds to a transmitted light absorption/recombination layer.

Figure 1:
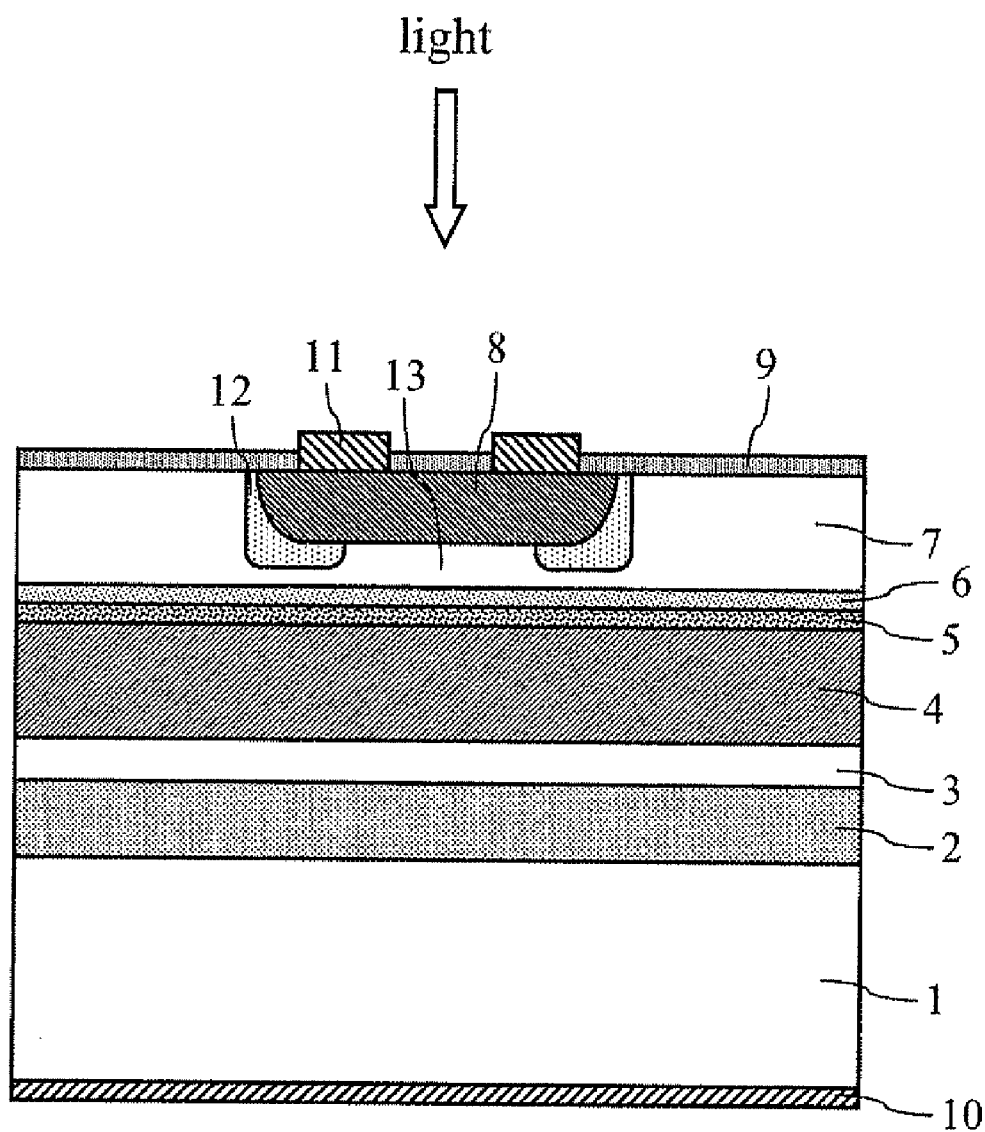
FIG. 1 is a cross-sectional view of an APD according to a first embodiment.

FIG. 1 is a cross-sectional view of an APD according to the present embodiment. Referring to the figure, over an n-type InP substrate 1 are formed a transmitted light absorption/recombination layer 2, a barrier layer 3, a wavelength selection/absorption layer 4, an undoped InGaAsP graded layer 5, an n-type InP electric field reduction layer 6, and an undoped InP window layer 7 also acting as a multiplication layer. A p-type diffusion layer region 8, corresponding to the impurity region of the second conductive type, is formed in the InP window layer 7. Further, a nonreflective film 9, also acting as a surface protective film, is formed on the InP window layer 7. The nonreflective film 9 may be formed of, for example, an SiN film. It should be noted that according to the present embodiment, the barrier layer 3 may be omitted.

Further according to the present embodiment, the wavelength selection/absorption layer 4 may be an InGaAsP layer or AlGaInAs layer having a bandgap wavelength of 1.4 μm.

The transmitted light absorption/recombination layer 2 absorbs the 1.55 μm wavelength light transmitted through the wavelength selection/absorption layer 4 and recombines the electrons and holes generated as a result of the absorption.

According to the present embodiment, the transmitted light absorption/recombination layer 2 may be, for example, an InGaAs layer, AlGaInAs layer, InGaAsP layer, or the like which has a bandgap wavelength longer than 1.55 μm.

The barrier layer 3 prevents the holes generated in the transmitted light absorption/recombination layer 2 from diffusing to the wavelength selection/absorption layer 4. Therefore, the barrier layer 3 is formed of a material having a larger bandgap than the transmitted light absorption/recombination layer 2. According to the present embodiment, the barrier layer 3 may be, for example, an InP layer, AlInAs layer, AlGaInAs layer, InGaAsP layer, or the like.

The wavelength selection/absorption layer 4 is an undoped or low carrier concentration, p-type or n-type semiconductor layer. The transmitted light absorption/recombination layer 2 and the barrier layer 3 are high carrier concentration n-type semiconductor layers. However, according to the present embodiment, only one of the transmitted light absorption/recombination layer 2 and the barrier layer 3 needs to be n-type.

It should be noted that according to the present embodiment, an n-type InP layer, corresponding to the semiconductor layer of the first conductive type, may be formed on an insulative substrate, and then the above transmitted light absorption/recombination layer 2, barrier layer 3, wavelength selection/absorption layer 4, undoped InGaAsP graded layer 5, n-type InP electric field reduction layer 6, and undoped InP window layer 7 may be formed over the n-type InP layer.

Still referring to FIG. 1, a cathode electrode 10 is a first electrode for energizing the n-type InP substrate 1, while an anode electrode 11 is a second electrode for energizing the p-type diffusion layer region 8. Further, reference numeral 12 denotes a guard ring region formed around the p-type diffusion layer region 8. The guard ring region is a p-type region having a low carrier concentration. Reference numeral 13 denotes a multiplication region.

Light with a wavelength of 1.3 μm entering the portion of the nonreflective film 9 not covered by the anode electrode 11, as shown at the top of the figure, goes through the InP window layer 7 since the bandgap wavelength of the InP window layer 7 is 0.92 μm, and reaches the wavelength selection/absorption layer 4. The wavelength selection/absorption layer 4 has a bandgap wavelength of 1.4 μm, which is longer than the wavelength of the incident light (1.3 μm). Therefore, the 1.3 μm wavelength light is absorbed by the wavelength selection/absorption layer 4, generating electrons and holes. Further, since the carrier concentration of the wavelength selection/absorption layer 4 is low, this layer is depleted when a bias voltage is applied to the APD. Therefore, the holes move to the multiplication region 13 and are multiplied therein. Then, they are drawn from the device as an electric current signal.

Light with a wavelength of 1.55 μm entering the APD shown in FIG. 1 from an optical fiber (not shown) also goes through the InP window layer 7 and reaches the wavelength selection/absorption layer 4. However, since the bandgap wavelength of the wavelength selection/absorption layer 4 is shorter than 1.55 μm, the light transmits through the wavelength selection/absorption layer 4 and reaches the transmitted light absorption/recombination layer 2 through the barrier layer 3. Since the bandgap wavelength of the transmitted light absorption/recombination layer 2 is longer than 1.55 μm, the 1.55 μm wavelength light is absorbed by the transmitted light absorption/recombination layer 2, generating electrons and holes. These generated electrons and holes recombine with each other within this layer, producing heat.

Thus, the APD of the present embodiment includes the wavelength selection/absorption layer 4 and the transmitted light absorption/recombination layer 2. This arrangement allows the 1.3 μm wavelength light to be selectively drawn from the device, as an electric current, while preventing the 1.55 μm wavelength light from being drawn.

The present embodiment also has the following effect due to the transmitted light absorption/recombination layer 2.

If the transmitted light absorption/recombination layer 2 is not provided, the 1.55 μm wavelength light that has been transmitted through the wavelength selection/absorption layer 4 is reflected from the cathode electrode 10 and returned to the wavelength selection/absorption layer 4. A portion of this returned light is absorbed by the wavelength selection/absorption layer 4, and some of the remaining portion is transmitted through the wavelength selection/absorption layer 4 and then emitted from the top of the APD. The emitted light returns to the optical fiber. These phenomena are undesirable since they reduce the wavelength selectivity ratio of the APD and increase the amount of light returned due to reflection.

On the other hand, with the transmitted light absorption/recombination layer 2 provided in the device, the light that has been transmitted through the wavelength selection/absorption layer 4 is prevented from returning to the wavelength selection/absorption layer 4. As a result, the APD has a high wavelength selectivity ratio, and in the APD the amount of light returned due to reflection is small.

Figure 2A:
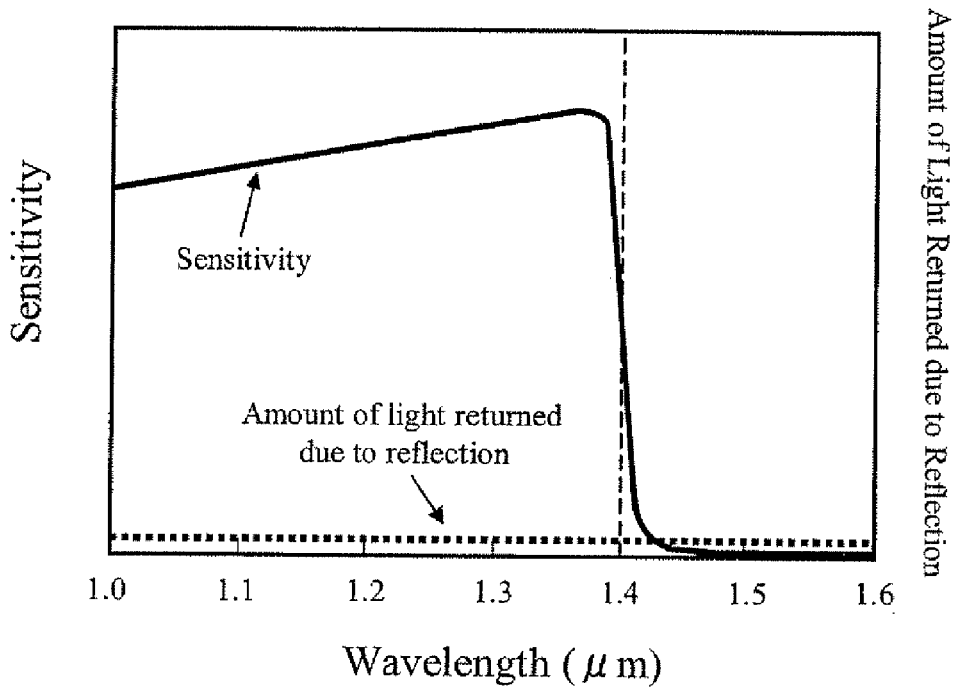
FIG. 2(a), in a first embodiment, shows wavelength dependence of sensitivity of an APD and of an amount of light returned due to reflection within the APD.
Figure 2B:
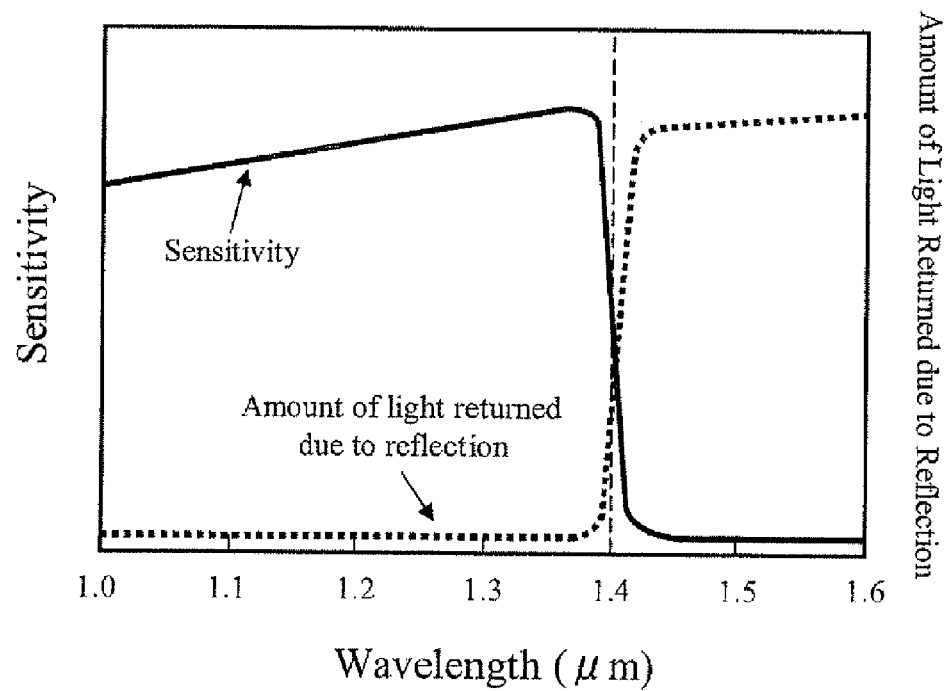
FIG. 2(b) shows the corresponding characteristics of a comparative example of the APD showing in FIG. 2(a).

FIG. 2(a) shows the wavelength dependence of the sensitivity of the APD of the present embodiment and the wavelength dependence of the amount of light returned due to reflection within the APD. FIG. 2(b) shows the corresponding characteristics of a comparative example in which the transmitted light absorption/recombination layer is not provided.

As can be seen by comparison between FIGS. 2(a) and 2(b), the APD of the present embodiment has reduced sensitivity to 1.4 μm and longer wavelengths, as compared to the comparative example. This indicates that the wavelength selectivity ratio can be increased by forming the transmitted light absorption/recombination layer. Further, in the comparative example the amount of light returned due to reflection drastically increases at a wavelength of around 1.4 μm and remains large at longer wavelengths, whereas in the APD of the present embodiment substantially no amount of returned light is observed regardless of the wavelength. Therefore, the transmitted light absorption/recombination layer is also effective in reducing the amount of light returned due to reflection.

The present embodiment does not necessarily require the barrier layer. However, to increase the wavelength selectivity ratio, it is preferable to form the barrier layer, as described below.

If the electrons and holes generated in the transmitted light absorption/recombination layer 2 have diffused to the wavelength selection/absorption layer 4, they are undesirably drawn from the device as an electric current signal since an electric field is applied to the wavelength selection/absorption layer 4. However, this can be prevented by forming the barrier layer 3, having a larger bandgap than the transmitted light absorption/recombination layer 2, between the transmitted light absorption/recombination layer 2 and the wavelength selection/absorption layer 4. Specifically, with this arrangement, the electrons and holes generated in the transmitted light absorption/recombination layer 2 can be prevented from diffusing to the wavelength selection/absorption layer 4 before they recombine with each other. Further, since the transmitted light absorption/recombination layer 2 and the barrier layer 3 have a high carrier concentration and hence are hardly depleted, the electrons and holes generated in the transmitted light absorption/recombination layer 2 do not pass through the barrier layer 3.

As described above, the semiconductor photodetector device of the present embodiment can selectively receive light having the shorter wavelength 1.3 µm without using a wavelength filter. Further, a wavelength filter having a simpler configuration than conventional wavelength filters may be used with the semiconductor photodetector device. Still further, a conventional wavelength filter may be used with the semiconductor photodetector device to further increase the selectivity ratio for the wavelength of light to be received.

Second Embodiment

Figure 3:
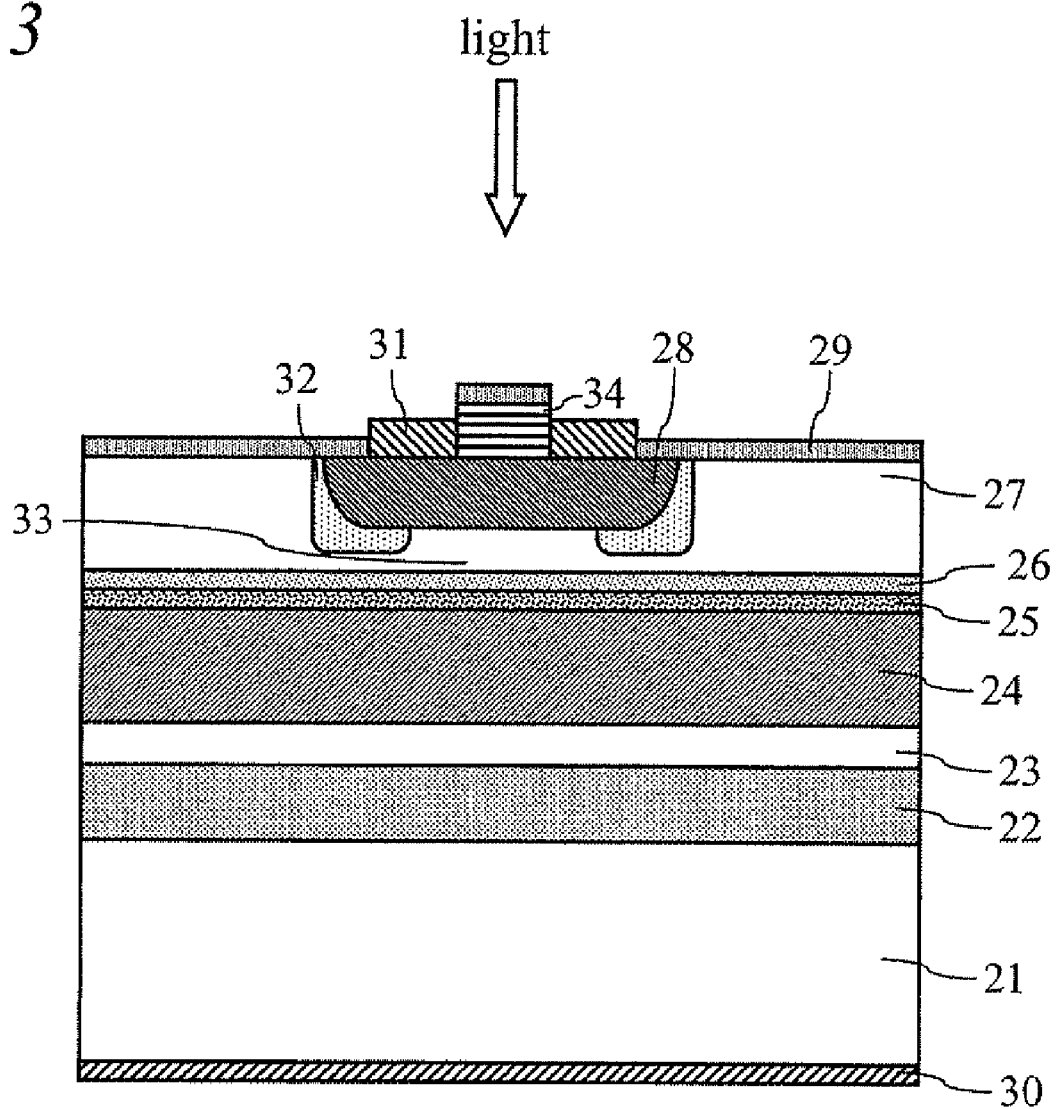
FIG. 3 is a cross-sectional view of an APD according to a second embodiment.

FIG. 3 is a cross-sectional view of an APD according to a second embodiment of the present invention. Referring to the figure, over an n-type InP substrate 21, also acting as a semiconductor layer of a first conductive type, are formed a transmitted light absorption/recombination layer 22 corresponding to a second absorption layer, a barrier layer 23, a wavelength selection/absorption layer 24 corresponding to a first absorption layer, an undoped InGaAsP graded layer 25, an n-type InP electric field reduction layer 26, and an undoped InP window layer 27 also acting as a multiplication layer. A p-type diffusion layer region 28, corresponding to an impurity region of the second conductive type, is formed in the InP window layer 27. Further, a nonreflective film 29, also acting as a surface protective film, is formed on the InP window layer 27. The nonreflective film 29 may be formed of, for example, an SiN film, It should be noted that according to the present embodiment, the barrier layer 23 may be omitted.

The present embodiment is different from the first embodiment in that a multilayered reflective layer 34 is formed on the p-type diffusion layer region 28.

The multilayered reflective layer 34 is formed by repeatedly laminating layers having different refractive indices. The multilayered reflective layer 34 reflects light at wavelengths longer than the bandgap wavelength of the wavelength selection/absorption layer 24.

According to the present embodiment, the multilayered reflective layer 34 reflects light at a wavelength of 1.55 µm, and is formed by, for example, repeatedly laminating an InP layer and an InGaAs layer (that is, InP/InGaAs/InP/InGaAs/...). In this case, the InGaAs layer may be replaced by an InGaAsP layer. Or alternatively, the multilayered reflective layer 34 may be formed by repeatedly laminating an AlInAs layer and a GaInAs layer (that is, AlInAs/GaInAs/AlInAs/GaInAs/...). In this case, the GaInAs layer may be replaced by an AlGaInAs layer. It should be noted that the multilayered reflective layer 34 may be a p-type semiconductor layer.

Further, each layer in the multilayered reflective layer 34 is set to an optical thickness of one quarter of the wavelength of the incident light to be reflected. For example, the optical thickness of each layer may be set to a quarter of 1.55 µm to reflect only 1.55 µm wavelength incident light. It should be noted that the multilayered reflective layer 34 may be undoped, p-type, or n-type.

According to the present embodiment, the wavelength selection/absorption layer 24, the transmitted light absorption/recombination layer 22, and the barrier layer 23 may be formed of the same materials as the corresponding layers of the first embodiment. Specifically, the wavelength selection/absorption layer 24 may be an InGaAsP layer or AlGaInAs layer having a bandgap wavelength of 1.4 µm. The transmitted light absorption/recombination layer 22 may be an InGaAs layer, AlGaInAs layer, InGaAsP layer, or the like which has a bandgap wavelength longer than 1.55 µm. The barrier layer 23 is formed of a material having a larger bandgap than the transmitted light absorption/recombination layer 22. Specifically, the barrier layer 23 may be an InP layer, AlInAs layer, AlGaInAs layer, InGaAsP layer, or the like.

The wavelength selection/absorption layer 24 is an undoped or low carrier concentration, p-type or n-type semiconductor layer. The transmitted light absorption/recombination layer 22 and the barrier layer 23 are high carrier concentration n-type layers.

It should be noted that according to the present embodiment, an n-type InP layer, corresponding to the semiconductor layer of the first conductive type, may be formed on an insulative substrate, and then the above transmitted light absorption/recombination layer 22, barrier layer 23, wavelength selection/absorption layer 24, undoped InGaAsP graded layer 25, n-type InP electric field reduction layer 26, and undoped InP window layer 27 may be formed over the n-type InP layer.

Still referring to FIG. 3, a cathode electrode 30 is a first electrode for energizing the n-type InP substrate 21, while an anode electrode 31 is a second electrode for energizing the p-type diffusion layer region 28. Further, reference numeral 32 denotes a guard ring region formed around the p-type diffusion layer region 28. The guard ring region is a p-type region having a low carrier concentration. Reference numeral 33 denotes a multiplication region.

Light with a wavelength of 1.3 µm entering the device from the top, as shown in FIG. 3, goes through the multilayered reflective layer 34 and reaches the InP window layer 27. Since the InP window layer 27 has a bandgap wavelength of 0.92 µm, which is shorter than 1.3 µm, the 1.3 µm wavelength light also goes through the InP window layer 27 and reaches the wavelength selection/absorption layer 24. The wavelength selection/absorption layer 24 has a bandgap wavelength of 1.4 µm, which is longer than the wavelength of the incident light (1.3 µm). Therefore, the 1.3 µm wavelength light is absorbed by the wavelength selection/absorption layer 24, generating electrons and holes. Further, since the carrier concentration of the wavelength selection/absorption layer 24 is low, this layer is depleted when a bias voltage is applied to the APD. Therefore, the holes move to the multiplication region 33 and are multiplied therein. Then, they are drawn from the device as an electric current signal.

On the other hand, light with a wavelength of 1.55 µm is reflected by the multilayered reflective layer 34. It should be noted that the multilayered reflective layer 34 typically has a reflectance of approximately 90% to 1.55 µm wavelength light. Therefore, 10% of the incident light goes through the multilayered reflective layer 34 and reaches the wavelength selection/absorption layer 24 through the InP window layer 27. Since the bandgap wavelength of the wavelength selection/absorption layer 24 is shorter than 1.55 µm, the light passes through the wavelength selection/absorption layer 24 and reaches the transmitted light absorption/recombination layer 22 through the barrier layer 23. Then, since the bandgap wavelength of the transmitted light absorption/recombination layer 22 is longer than 1.55 µm, the 1.55 µm wavelength light that has gone through the multilayered reflective layer 34, etc. is absorbed by the transmitted light absorption/recombination layer 22, generating electrons and holes. These generated electrons and holes recombine with each other within this layer, producing heat.

The present embodiment has the following effect in addition to the effects described with regard to the first embodiment. Since the multilayered reflective layer reflects a major portion of the 1.55 µm wavelength light, it is possible to reduce the amount of 1.55 µm wavelength light absorbed by the wavelength selection/absorption layer. Specifically, by providing the multilayered reflective layer having a reflectance of 90%, the selection ratio of 1.3 µm wavelength light to 1.55 µm wavelength light can be increased by a factor of approximately 10, as compared to the first embodiment.

Third Embodiment

Figure 4:
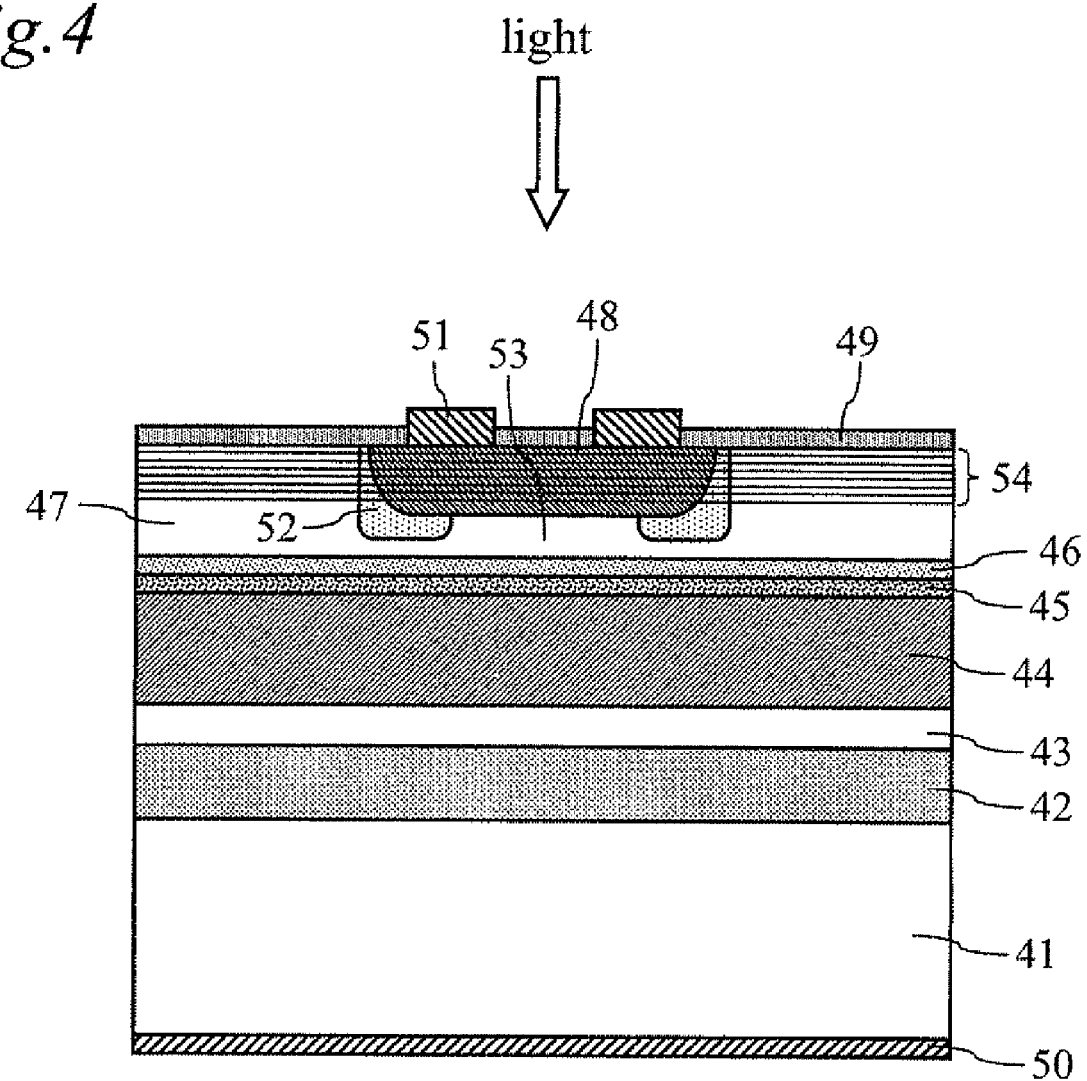
FIG. 4 is a cross-sectional view of an APD according to a third embodiment.

FIG. 4 is a cross-sectional view of an APD according to a third embodiment of the present invention. Referring to the figure, over an n-type InP substrate 41, also acting as a semiconductor layer of a first conductive type, are formed a transmitted light absorption/recombination layer 42, a barrier layer 43, a wavelength selection/absorption layer 44, an undoped InGaAsP graded layer 45, an n-type InP electric field reduction layer 46, and an undoped InP window layer 47 also acting as a multiplication layer. The wavelength selection/absorption layer 44, the transmitted light absorption/recombination layer 42, and the barrier layer 43 may be formed of the same materials as the corresponding layers of the first embodiment. It should be noted that according to the present embodiment, the barrier layer 43 may be omitted.

The present embodiment is characterized in that a multilayered reflective layer 54, also acting as a window layer, is formed on the InP window layer 47. The multilayered reflective layer 54 is formed of the same material as the corresponding layer of the second embodiment.

A p-type diffusion layer region 48, corresponding to an impurity region of a second conductive type, is formed in the InP window layer 47 and in the multilayered reflective layer 54. Further, a nonreflective film 49, also acting as a surface protective film, is formed on the multilayered reflective layer 54. The nonreflective film 49 may be formed of, for example, an SiN film.

It should be noted that according to the present embodiment, an n-type InP layer, corresponding to the semiconductor layer of the first conductive type, may be formed on an insulative substrate, and then the above transmitted light absorption/recombination layer 42, barrier layer 43, wavelength selection/absorption layer 44, undoped InGaAsP graded layer 45, n-type InP electric field reduction layer 46, and undoped InP window layer 47 may be formed over the n-type InP layer.

Still referring to FIG. 4, a cathode electrode 50 is a first electrode for energizing the n-type InP substrate 41, while an anode electrode 51 is a second electrode for energizing the p-type diffusion layer region 48. Further, reference numeral 52 denotes a guard ring region formed around the p-type diffusion layer region 48. The guard ring region 52 is a p-type region having a low carrier concentration. Reference numeral 53 denotes a multiplication region.

The present embodiment has the following effects in addition to the effects described with regard to the second embodiment. By forming a multilayered reflective film also acting as a window layer, it is possible to reduce the total crystal growth thickness of the layers making up the APD. Further, the anode electrode side of the APD can be formed such that its surface is flat, as compared to the second embodiment.

Fourth Embodiment

Figure 5:
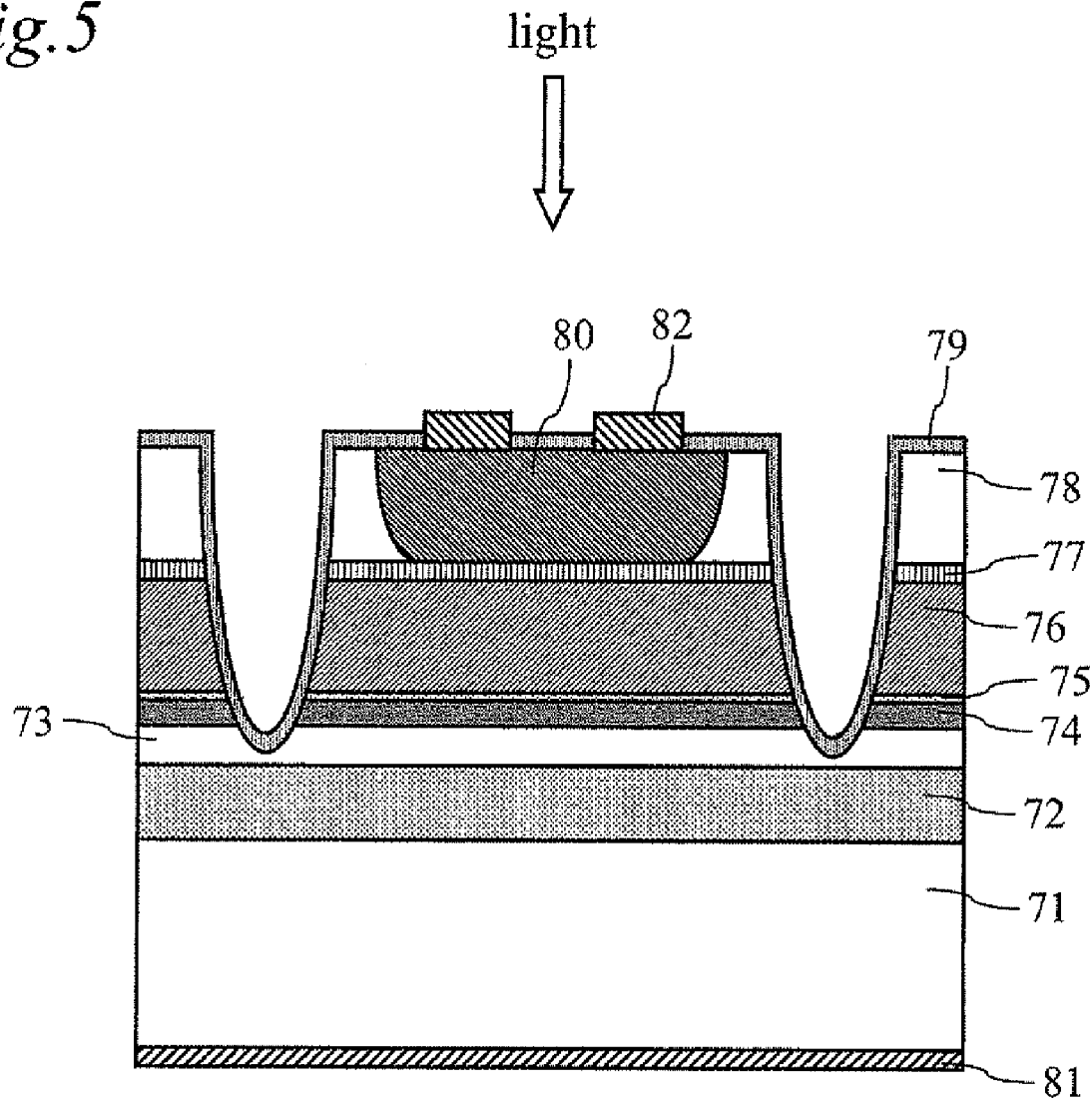
FIG. 5 is a cross-sectional view of an APD according to a fourth embodiment.

FIG. 5 is a cross-sectional view of an APD according to a fourth embodiment of the present invention. Referring to the figure, over an n-type InP substrate 71, also acting as a semiconductor layer of a first conductive type, are formed a transmitted light absorption/recombination layer 72, a barrier layer 73, an AlInAs multiplication layer 74, a p-type InP electric field reduction layer 75, a wavelength selection/absorption layer 76, an undoped InGaAsP graded layer 77, and an undoped InP window layer 78. It should be noted that according to the present embodiment, the barrier layer 78 may be omitted.

Thus, the present embodiment is characterized in that a multiplication layer of AlInAs and an electric field reduction layer are formed between the barrier layer and the wavelength selection/absorption layer in that order. This structure has the same effect as that described with regard to the first embodiment.

The wavelength selection/absorption layer 76, the transmitted light absorption/recombination layer 72, and the barrier layer 73 may be formed of the same materials as the corresponding layers of the first embodiment.

A nonreflective film 79, also acting as a surface protective film, is formed on the InP window layer 78. The nonreflective film 79 may be formed of, for example, an SiN film.

It should be noted that according to the present embodiment, an n-type InP layer, corresponding to the semiconductor layer of the first conductive type, may be formed on an insulative substrate, and then the above transmitted light absorption/recombination layer 72, barrier layer 73, AlInAs multiplication layer 74, p-type InP electric field reduction layer 75, wavelength selection/absorption layer 76, undoped InGaAsP graded layer 77, and undoped InP window layer 78 may be formed over the n-type InP layer.

Still referring to FIG. 5, a p-type diffusion layer region 80, corresponding to an impurity region of a second conductive type, is formed in the InP window layer 78. Further, a cathode electrode 51 is a first electrode for energizing the n-type InP substrate 71, while an anode electrode 82 is a second electrode for energizing the p-type diffusion layer region 80.

It should be noted that in the APD shown in FIG. 5, the AlInAs multiplication layer 74 and the p-type InP electric field reduction layer 75 are provided under the wavelength selection/absorption layer 76 to inject electrons into the AlInAs multiplication layer 74. Therefore, according to the present embodiment, since the AlInAs multiplication layer 74, at which electric field concentration occurs, is not in contact with the p-type diffusion layer region 80, a guard ring need not be provided around the p-type diffusion layer region 80.

Fifth Embodiment

A semiconductor photodetector device of a fifth embodiment of the present invention includes a laminated structure made up of a semiconductor layer of a first conductive type, a first absorption layer, and a window layer formed from bottom to top in that order, and light enters the device from the "semiconductor layer of the first conductive type" side. The window layer includes an impurity region of a second conductive type, and a second absorption layer having a smaller bandgap than the first absorption layer is provided on the window layer. Further, a multilayered reflective layer for reflecting light at wavelengths loner than the bandgap wavelength of the first absorption layer is provided between the semiconductor layer of the first conductive type and the first absorption layer.

According to the present embodiment, the semiconductor layer of the first conductive type corresponds to an n-type InP substrate; the first absorption layer corresponds to a wavelength selection/absorption layer; and the second absorption layer corresponds to a transmitted light absorption/recombination layer.

Figure 6:
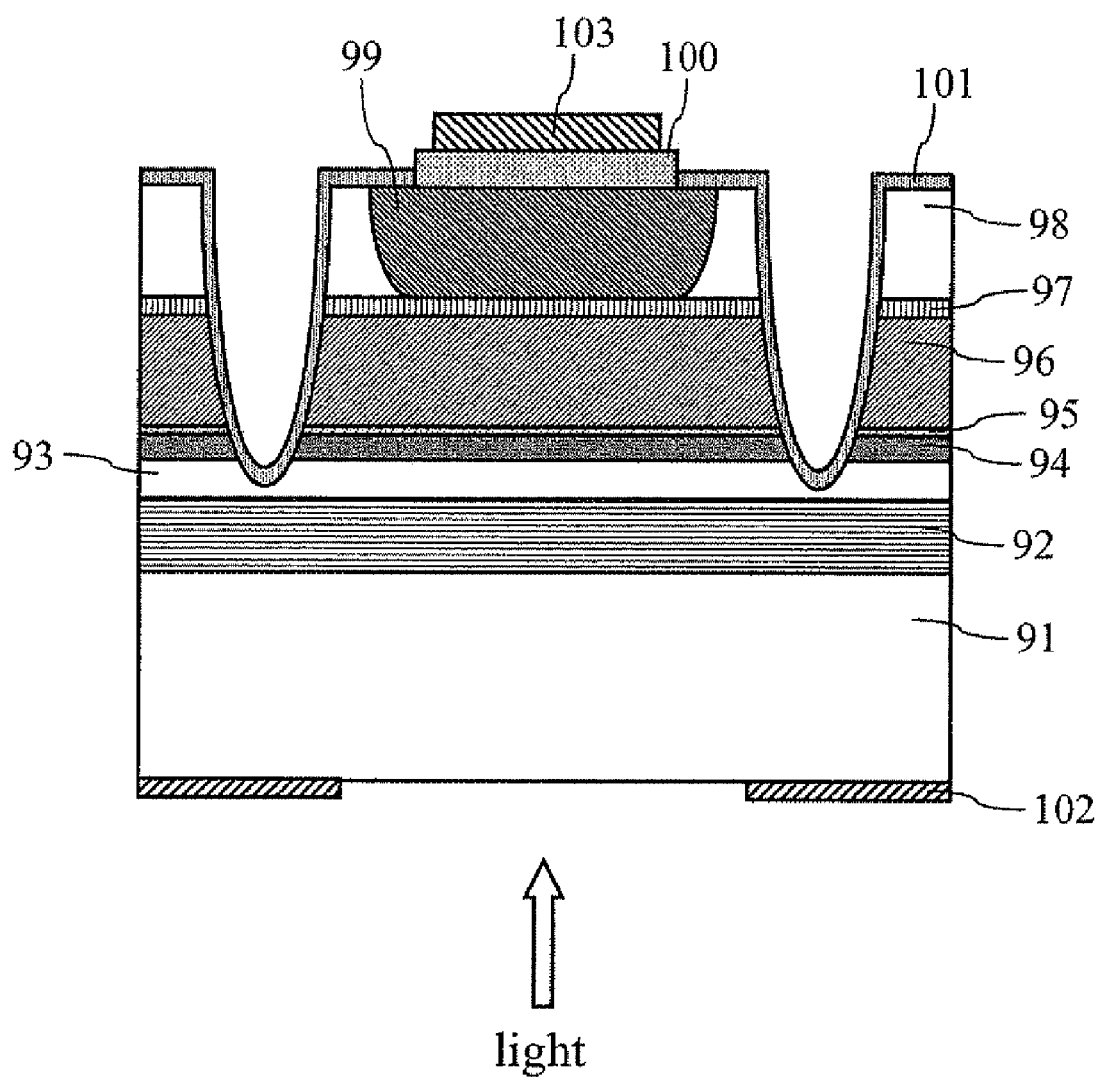
FIG. 6 is a cross-sectional view of an APD according to a fifth embodiment.

FIG. 6 is a cross-sectional view of an APD according to the present embodiment. Referring to the figure, over an n-type InP substrate 91 are formed a multilayered reflective layer 92, a barrier layer 93, an AlInAs multiplication layer 94, a p-type InP electric field reduction layer 95, a wavelength selection/absorption layer 96, an undoped InGaAsP graded layer 97, and an undoped InP window layer 98.

The wavelength selection/absorption layer 96 may be formed of the same material as the corresponding layer of the first embodiment.

The multilayered reflective layer 92 reflects light at wavelengths longer than the bandgap wavelength of the wavelength selection/absorption layer 96. On the other hand, the barrier layer 93 has a larger bandgap than the multilayered reflective layer 92. According to the present embodiment, at least one of the multilayered reflective layer 92 and the barrier layer 93 may be an n-type semiconductor layer. It should be noted that according to the present embodiment, the barrier layer 93 may be omitted.

A p-type diffusion layer region 99, corresponding to the impurity region of the second conductive type, is formed in the InP window layer 98, and a transmitted light absorption/recombination layer 100 is formed on the p-type diffusion layer region 99. The transmitted light absorption/recombination layer 100 may be a p-type semiconductor layer.

A nonreflective film 101, also acting as a surface protective film, is formed on the portions of the InP window layer 98 not covered by the transmitted light absorption/recombination layer 100. The nonreflective film 101 may be formed of, for example, an SiN film.

A cathode electrode 102, which is a first electrode for energizing the n-type InP substrate 91, is formed on a predetermined region of the back surface of the n-type InP substrate 91. On the other hand, an anode electrode 103, which is a second electrode for energizing the p-type diffusion layer region 99, is formed on the transmitted light absorption/recombination layer 100. Light enters the portion of the back surface of the n-type InP substrate 91 not covered by the cathode electrode 102.

It should be noted that according to the present embodiment, an n-type InP layer, corresponding to the semiconductor layer of the first conductive type, may be formed on an insulative substrate, and then the above multilayered reflective layer 92, barrier layer 93, AlInAs multiplication layer 94, p-type InP electric field reduction layer 95, wavelength selection/absorption layer 96, undoped InGaAsP graded layer 97, and undoped InP window layer 98 may be formed over the n-type InP layer.

The operation of the APD of the present embodiment will now be described.

Light with a wavelength of 1.3 μm entering the n-type InP substrate 91, as shown at the bottom of FIG. 6, goes through the multilayered reflective film 92 and reaches the wavelength selection/absorption layer 96. Since the wavelength selection/absorption layer 96 has a bandgap wavelength of 1.4 μm, which is longer than the wavelength of the incident light (1.3 μm), the 1.3 μm wavelength light is absorbed by the wavelength selection/absorption layer 96, generating electrons and holes, which are drawn from the device as an electric current signal.

On the other hand, light with a wavelength of 1.55 μm is reflected by the multilayered reflective layer 92. It should be noted that the multilayered reflective layer 92 typically has a reflectance of approximately 90% to 1.55 μm wavelength light. Therefore, 10% of the incident light goes through the multilayered reflective layer 92 and reaches the transmitted light absorption/recombination layer 100 through the InP window layer 98. Then, since the bandgap wavelength of the transmitted light absorption/recombination layer 100 is longer than 1.55 μm, the 1.55 μm wavelength light, that has gone through the multilayered reflective layer 92, is absorbed by the transmitted light absorption/recombination layer 100, generating electrons and holes. These generated electrons and holes recombine with each other within this layer, producing heat.

The present embodiment has the following effects in addition to the effects described with regard to the first and second embodiments. Since the multilayered reflective layer is provided between the n-type InP substrate and the barrier layer, the thickness of the multilayered reflective layer can be increased without degrading the flatness of the APD surface. This allows the reflectance of the multilayered reflective layer to be increased.

Sixth Embodiment

A semiconductor photodetector device of a sixth embodiment of the present invention includes a laminated structure made up of a semiconductor layer of a first conductive type, a first absorption layer, and a window layer formed from bottom to top in that order, and light enters the device from the window layer side. The window layer includes an impurity region of a second conductive type, and a second absorption layer having a larger bandgap than the first absorption layer is provided on the window layer side of the first absorption layer. Particularly, according to the present embodiment, a multilayered reflective layer for reflecting light at wavelengths longer than the bandgap wavelength of the first absorption layer may be laminated to the window layer, and then the second absorption layer may be laminated to the multilayered reflective layer. Further, a third absorption layer having a smaller bandgap than the first absorption layer is provided on the "semiconductor layer of the first conductive type" side of the first absorption layer. Specifically, the third absorption layer may be provided between the semiconductor layer of the first conductive type and the first absorption layer.

According to the present embodiment, the semiconductor layer of the first conductive type corresponds to an n-type InP substrate; the first absorption layer corresponds to a wavelength selection/absorption layer, the second absorption layer corresponds to a wavelength selection/recombination layer; and the third absorption layer corresponds to a transmitted light absorption/recombination layer.

Figure 7:
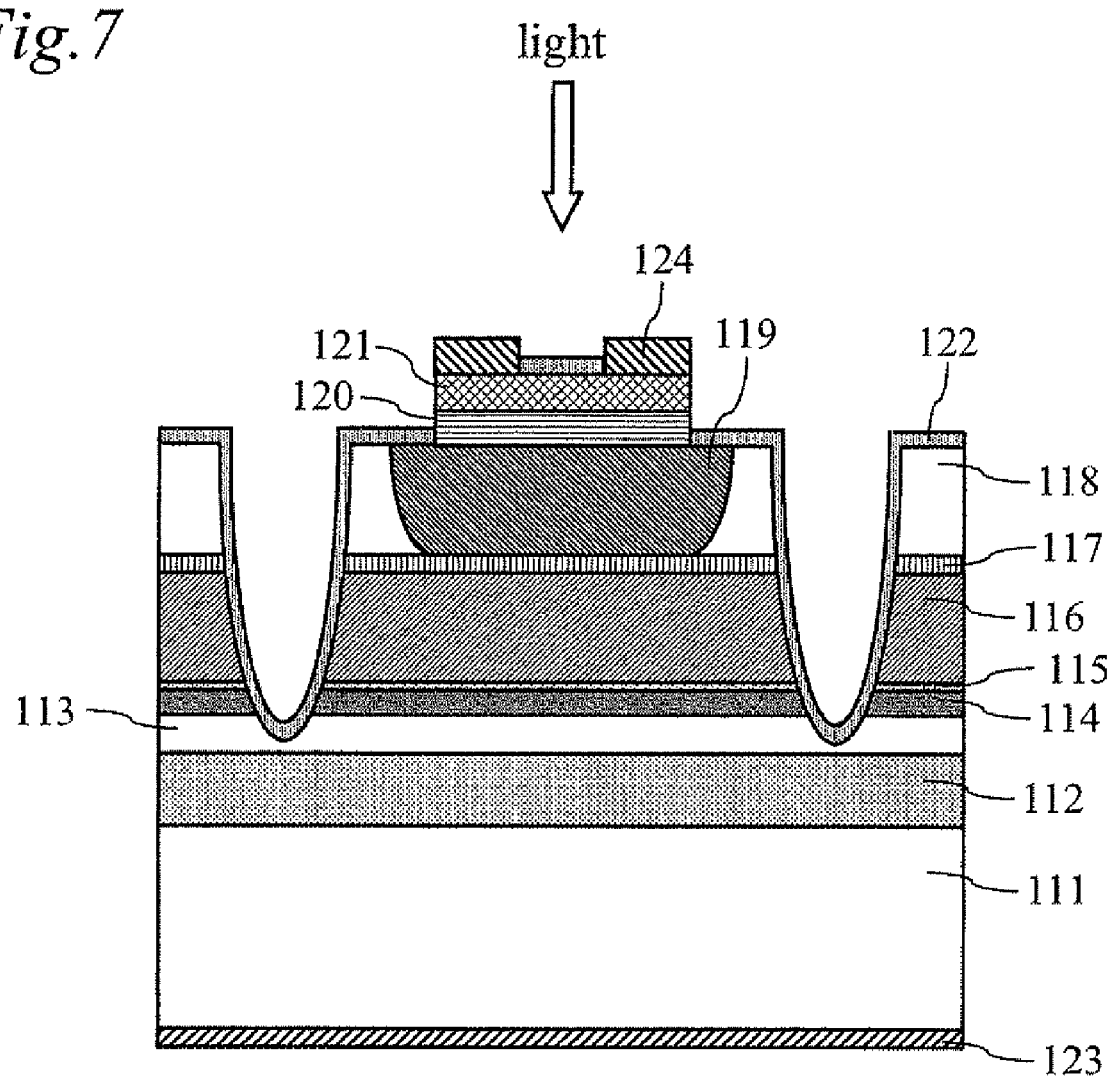
FIG. 7 is a cross-sectional view of an APD according to a sixth embodiment.

FIG. 7 is a cross-sectional view of an APD according to the present embodiment. Referring to the figure, over an n-type InP substrate 111, also acting as the semiconductor layer of the first conductive type, are formed a transmitted light absorption/recombination layer 112, a barrier layer 113, an AlInAs multiplication layer 114, a p-type InP electric field reduction layer 115, a wavelength selection/absorption layer 116, an undoped InGaAsP graded layer 117, and an undoped InP window layer 118. The wavelength selection/absorption layer 116 may be formed of the same material as the corresponding layer of the first embodiment.

The barrier layer 113 has a larger bandgap than the transmitted light absorption/recombination layer 112 and may be an n-type semiconductor layer. It should be noted that according to the present embodiment, the barrier layer 113 may be omitted.

Further according to the present embodiment, a second barrier layer may be provided between the wavelength selection/absorption layer 116 and a wavelength selection/recombination layer 121 in addition to or in place of the barrier layer 113. The second barrier layer may be a p-type semiconductor layer.

A p-type diffusion layer region 119, corresponding to the impurity region of the second conductive type, is formed in the InP window layer 118. Further, a multilayered reflective layer 120 and the wavelength selection/recombination layer 121 are formed over the p-type diffusion layer region 119. The multilayered reflective layer 120 may be a p-type semiconductor layer.

A nonreflective film 122, also acting as a surface protective film, is formed on the portions of the InP window layer 118 not covered by the multilayered reflective film 120. The nonreflective film 122 may be formed of, for example, an SiN film.

Still referring to FIG. 7, a cathode electrode 123 is a first electrode for energizing the n-type InP substrate 111, while an anode electrode 124 is a second electrode for energizing the p-type diffusion layer region 119.

It should be noted that according to the present embodiment, an n-type InP layer, corresponding to the semiconductor layer of the first conductive type, may be formed on an insulative substrate, and then the above transmitted light absorption/recombination layer 112, barrier layer 113, AlInAs multiplication layer 114, p-type InP electric field reduction layer 115, wavelength selection/absorption layer 116, undoped InGaAsP graded layer 117, and undoped InP window layer 118 may be formed over the n-type InP layer.

The present embodiment assumes that three wavelengths of light (for example, 1.3 μm, 1.49 μm, and 1.55 μm) enter the device. In this case, the bandgap wavelength of the wavelength selection/recombination layer 121 may be set to 1.4 μm, and the bandgap wavelength of the wavelength selection/absorption layer 116 may be set to 1.52 μm.

The 1.3 μm wavelength light entering the device from the top, as shown in FIG. 7, is absorbed by the wavelength selection/recombination layer 121, generating electrons and holes. Since no electric field is applied to the wavelength selection/recombination layer 121, the generated electrons and holes recombine with each other within this layer and hence disappear.

The 1.55 μm wavelength light, on the other hand, transmits through the wavelength selection/recombination layer 121 and then is reflected by the multilayered reflective layer 120. At that time, however, a portion of the light goes through the multilayered reflective layer 120 and reaches the wavelength selection/absorption layer 116. Then, since the bandgap wavelength of the wavelength selection/absorption layer 116 is shorter than 1.55 μm, the light, that has gone through the multilayered reflective layer 120, also goes through the wavelength selection/absorption layer 116 and reaches the transmitted light absorption/recombination layer 112 through the barrier layer 113. The light that has reached the transmitted light absorption/recombination layer 112 is absorbed therein, generating electrons and holes. The generated electrons and holes recombine with each other within this layer and hence disappear.

Therefore, the 1.3 μm wavelength light and the 1.55 μm wavelength light are not output from the device as electric current signals.

On the other hand, the 1.49 μm wavelength light passes through the wavelength selection/recombination layer 121 and the multilayered reflective layer 120 and reaches the wavelength selection/absorption layer 116. Then, since the wavelength selection/absorption layer 116 has a bandgap wavelength of 1.52 μm, which is longer than the wavelength of the incident light (1.49 μm), the 1.49 μm wavelength light is absorbed by the wavelength selection/absorption layer 116, generating electrons and holes, which are drawn from the device as an electric current signal.

Figure 8:
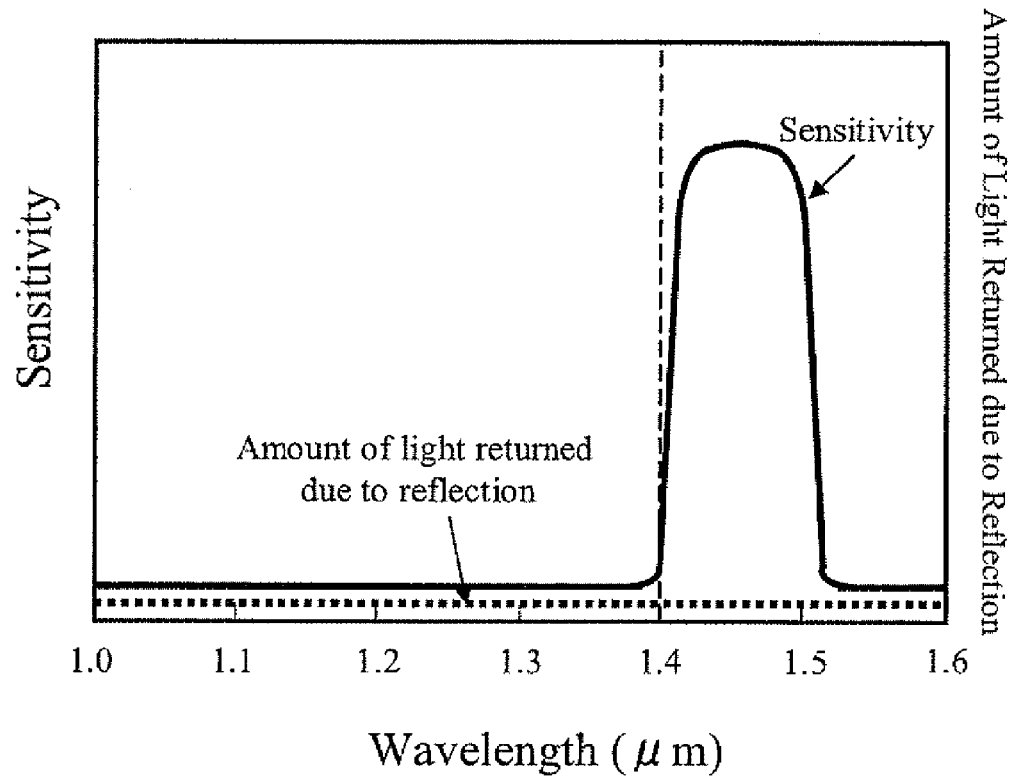
FIG. 8 in a sixth embodiment, shows wavelength dependence of sensitivity of an APD and of an amount of light returned due to reflection within the APD.

FIG. 8 shows the wavelength dependence of the sensitivity of the APD of the present embodiment and the wavelength dependence of the amount of light returned due to reflection within the APD. As can be seen from the figure, the APD of the present embodiment has sensitivity to the wavelength range from 1.4 μm to 1.52 μm.

As described above, the APD of the present embodiment includes a wavelength selection/recombination layer to absorb light at wavelengths shorter than the bandgap wavelength of the layer. Therefore, this layer may be combined with a multilayered reflective layer, a wavelength selection/absorption layer, a barrier layer, and a transmitted light absorption/recombination layer so as to selectively extract the middle one of three wavelengths.

Seventh Embodiment

A semiconductor photodetector device of a seventh embodiment of the present invention includes a laminated structure made up of a semiconductor layer of a first conductive type, a first absorption layer, and a window layer formed from bottom to top in that order, and light enters the device from the "semiconductor layer of the first conductive type" side. The window layer includes an impurity region of a second conductive type, and a second absorption layer having a smaller bandgap than the first absorption layer is provided on the window layer side of the first absorption layer. Specifically, the second absorption layer may be provided on the window layer. Further, a third absorption layer having a larger bandgap than the first absorption layer is provided on the "semiconductor layer of the first conductive type" side of the first absorption layer. Specifically, the third absorption layer may be provided between the semiconductor layer of the first conductive type and the first absorption layer.

According to the present embodiment, the semiconductor layer of the first conductive type corresponds to an n-type InP substrate; the first absorption layer corresponds to a wavelength selection/absorption layer; the second absorption layer corresponds to a transmitted light absorption/recombination layer; and the third absorption layer corresponds to a wavelength selection/recombination layer.

Figure 9:
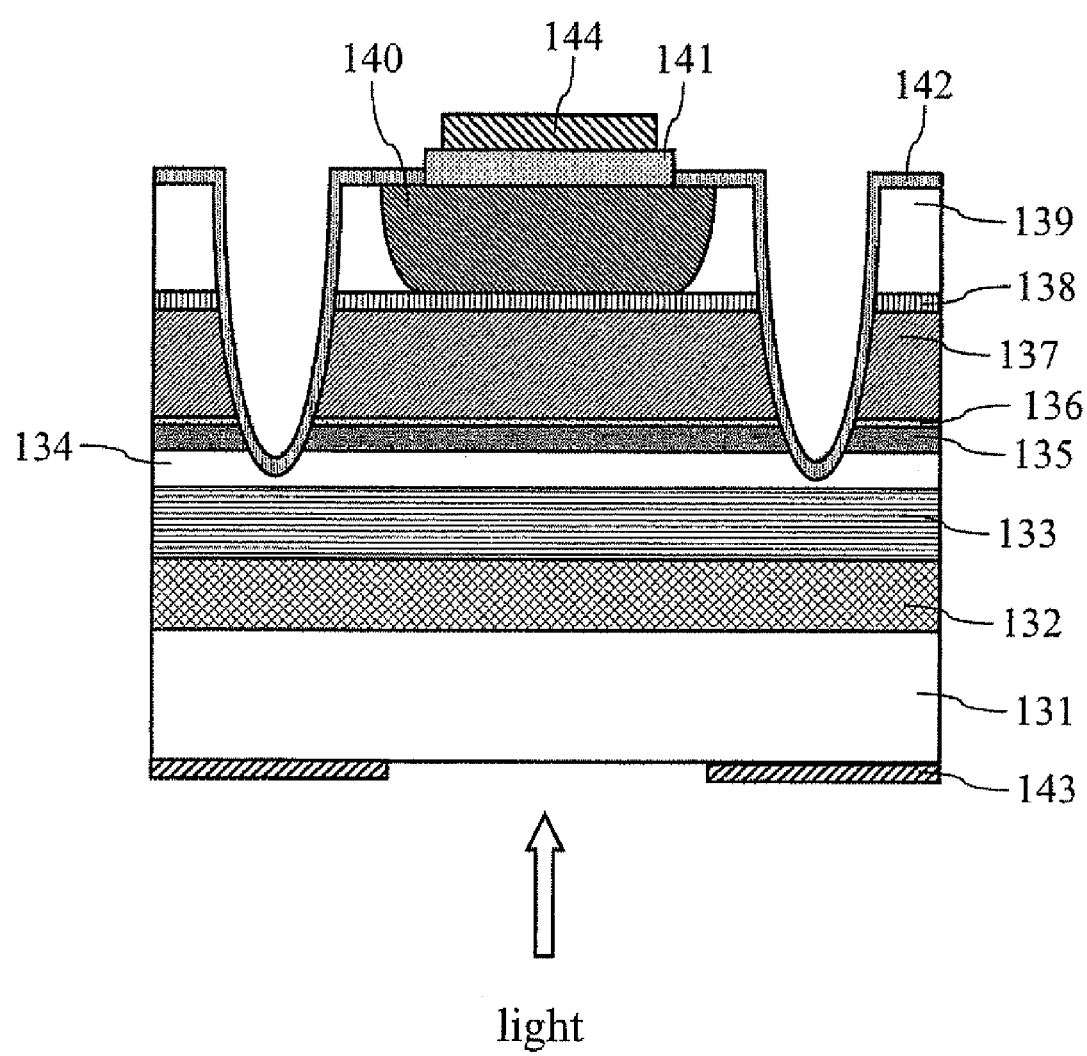
FIG. 9 is a cross-sectional view of an APD according to a seventh embodiment.

FIG. 9 is a cross-sectional view of an APD according to the present embodiment. This APD is a variation of the APD of the sixth embodiment, adapted to receive light incident on its back surface. Referring to the figure, over an n-type InP substrate 131 are formed a wavelength selection/recombination layer 132, a multilayered reflective layer 133, a barrier layer 134, an AlInAs multiplication layer 135, a p-type InP electric field reduction layer 136, a wavelength selection/absorption layer 137, an undoped InGaAsP graded layer 138, and an undoped InP window layer 139.

The multilayered reflective layer 133 reflects light at wavelengths longer than the bandgap wavelength of the wavelength selection/absorption layer 137. The multilayered reflective layer 133 may be an n-type semiconductor layer.

The barrier layer 134 has a larger bandgap than the multilayered reflective layer 133 and may be an n-type semiconductor layer. It should be noted that according to the present embodiment, the barrier layer 134 may be omitted.

A p-type diffusion layer region 140, corresponding to the impurity region of the second conductive type, is formed in the InP window layer 139. Further, a transmitted light absorption/recombination layer 141 is formed on the p-type diffusion layer region 140. Further, a nonreflective film 142, also acting as a surface protective film, is formed on the portions of the InP window layer 139 not covered by the transmitted light absorption/recombination layer 141. The nonreflective film 142 may be formed of, for example, an SiN film.

A cathode electrode 143, which is a first electrode for energizing the n-type InP substrate 131, is formed on a predetermined region of the back surface of the n-type InP substrate 131. On the other hand, an anode electrode 144, which is a second electrode for energizing the p-type diffusion layer region 140, is formed on the transmitted light absorption/recombination layer 141. Light enters the portion of the back surface of the n-type InP substrate 131 not covered by the cathode electrode 143.

It should be noted that according to the present embodiment, an n-type InP layer, corresponding to the semiconductor layer of the first conductive type, may be formed on an insulative substrate, and then the above wavelength selection/recombination layer 132, multilayered reflective layer 133, barrier layer 134, AlInAs multiplication layer 135, p-type InP electric field reduction layer 136, wavelength selection/absorption layer 137, undoped InGaAsP graded layer 138, and undoped InP window layer 139 may be formed over the n-type InP layer.

The present embodiment assumes that three wavelengths of light (for example, 1.3 µm, 1.49 µm, and 1.55 µm) enter the device. In this case, the bandgap wavelength of the wavelength selection/recombination layer 132 may be set to 1.4 µm, and the bandgap wavelength of the wavelength selection/absorption layer 137 may be set to 1.52 µm.

The 1.3 µm wavelength light entering the device from the bottom, as shown in FIG. 9, is absorbed by the wavelength selection/recombination layer 132, generating electrons and holes. Since no electric field is applied to the wavelength selection/recombination layer 132, the generated electrons and holes recombine with each other within this layer and hence disappear.

The 1.55 µm wavelength light, on the other hand, transmits through the wavelength selection/recombination layer 132 and then is reflected by the multilayered reflective layer 133. At that time, however, a portion of the light goes through the multilayered reflective layer 133 and reaches the transmitted light absorption/recombination layer 141 through the window layer 139. Then, if the bandgap wavelength of the transmitted light absorption/recombination layer 141 is longer than 1.55 µm, the 1.55 µm wavelength light that has reached the transmitted light absorption/recombination layer 141 is absorbed therein, generating electrons and holes. The generated electrons and holes recombine with each other within this layer and hence disappear.

Therefore, the 1.3 µm wavelength light and the 1.55 µm wavelength light are not output from the device as electric current signals.

On the other hand, the 1.49 µm wavelength light passes through the wavelength selection/recombination layer 132 and the multilayered reflective layer 133 and reaches the wavelength selection/absorption layer 137. Then, since the wavelength selection/absorption layer 137 has a bandgap wavelength of 1.52 µm, which is longer than the wavelength of the incident light (1.49 µm), the 1.49 µm wavelength light is absorbed by the wavelength selection/absorption layer 137, generating electrons and holes, which are then drawn from the device as an electric current signal.

As described above, the APD of the present embodiment, adapted to receive light incident on its back surface, includes a wavelength absorption/recombination layer to absorb light at wavelengths shorter than the bandgap wavelength of the layer. Therefore, this layer may be combined with a multilayered reflective layer, a wavelength selection/absorption layer, a barrier layer, and a transmitted light absorption/recombination layer so as to selectively extract the middle one of three wavelengths.

Eighth Embodiment

The first to seventh embodiments have been described as applied to APDs. However, the present invention can also be applied to another type of semiconductor photodetector device, namely photodiode (PD).

Figure 10:
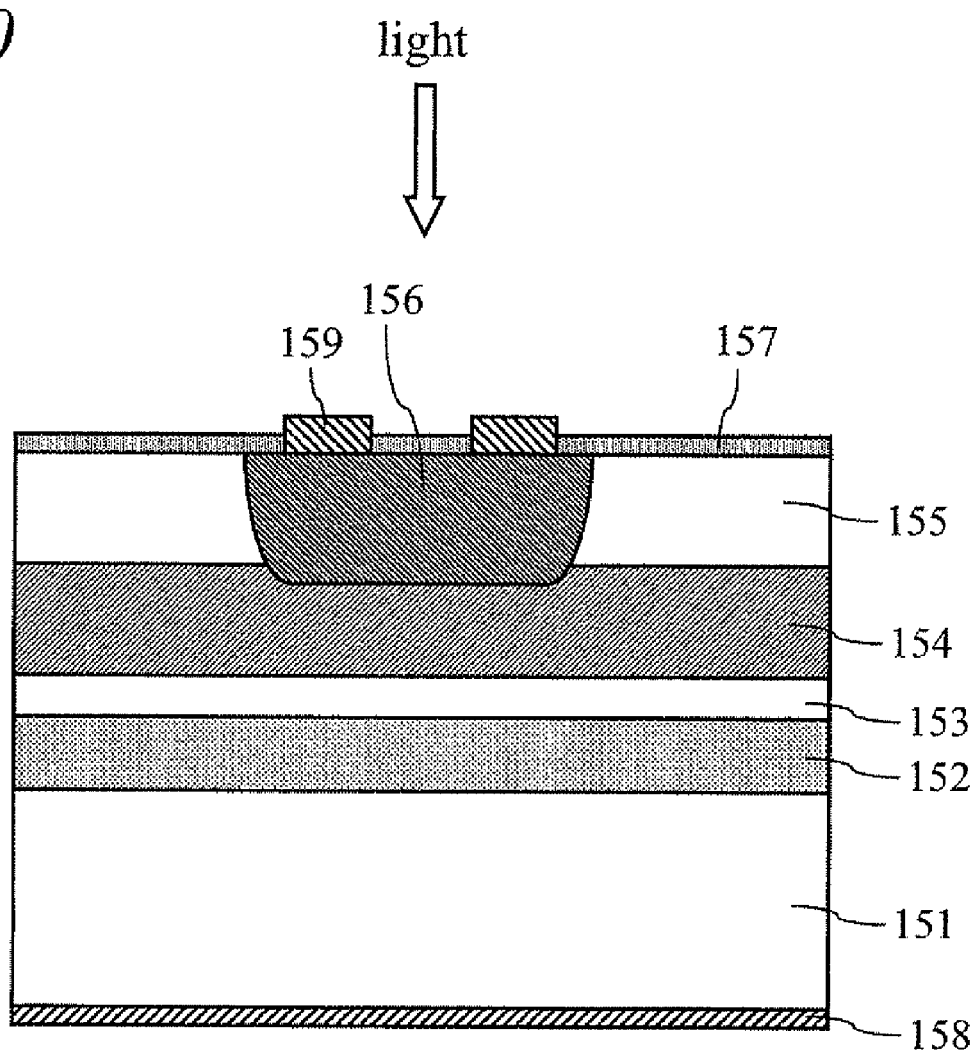
FIG. 10 is a cross-sectional view of an PD according to a eighth embodiment.
Figure 11:
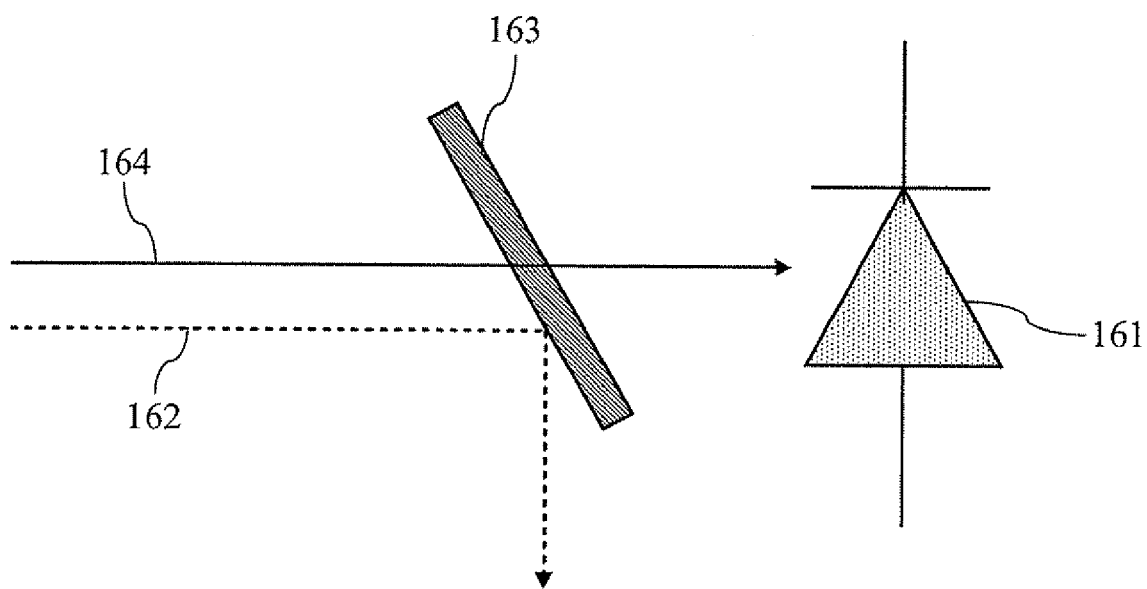
FIG. 11 is a diagram showing the configuration of a conventional optical receiver.
Figure 12:
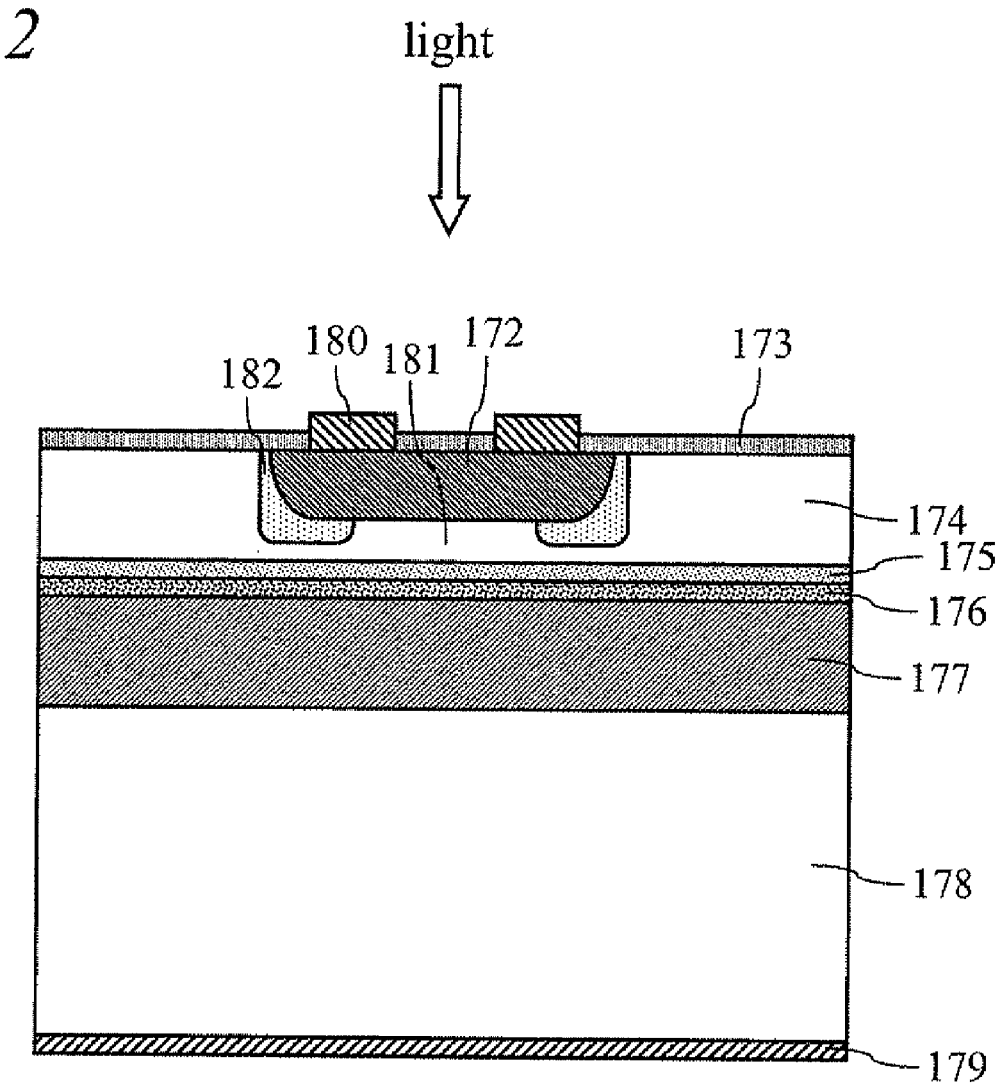
FIG. 12 is a cross-sectional view of one conventional APD.
Figure 13:
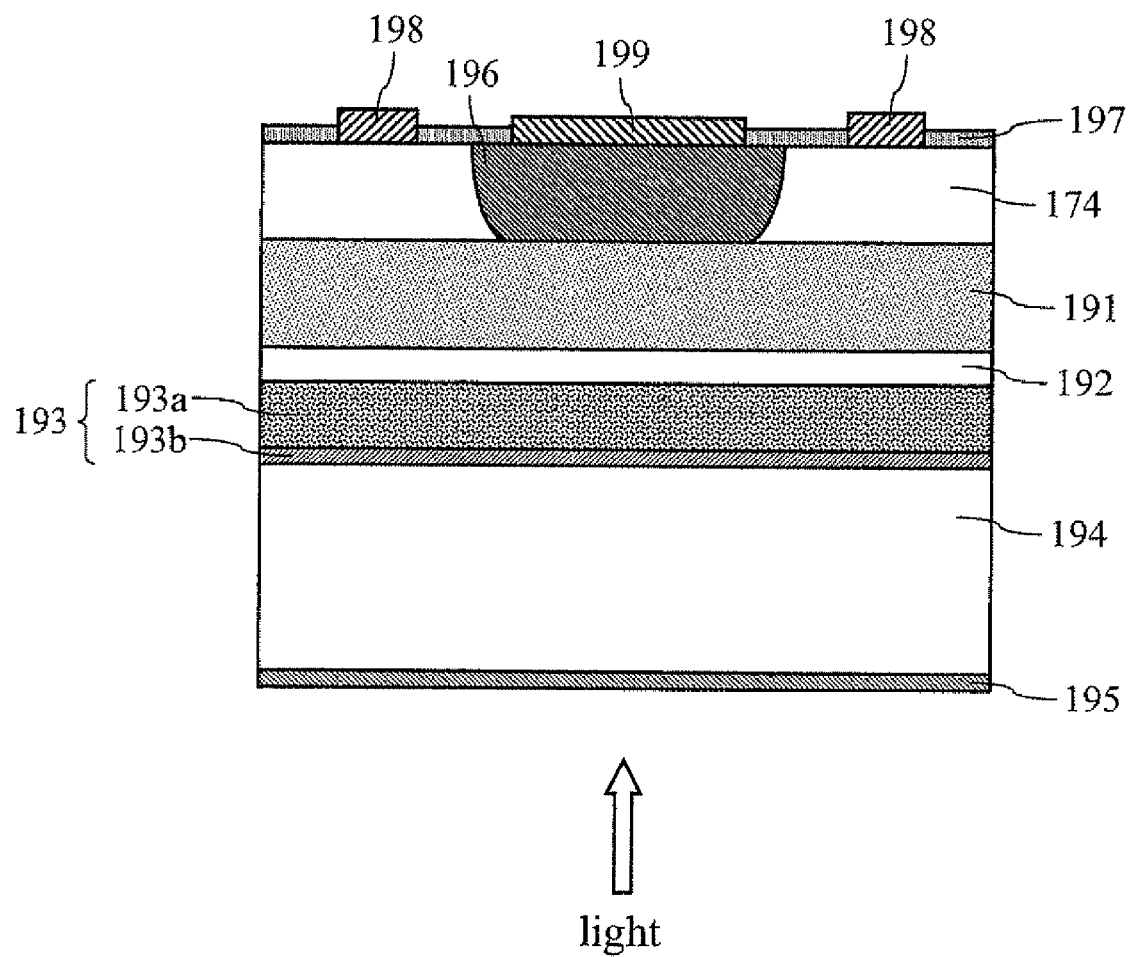
FIG. 13 is a cross-sectional view of another conventional APD.

FIG. 10 is a cross-sectional view of a PD according to an eighth embodiment of the present invention. Referring to the figure, over an n-type InP substrate 151, also acting as a semiconductor layer of a first conductive type, are formed a transmitted light absorption/recombination layer 152, a barrier layer 153, a wavelength selection/absorption layer 154, and an undoped InP window layer 155. The wavelength selection/absorption layer 154, the transmitted light absorption/recombination layer 152, and the barrier layer 153 may be formed of the same materials as the corresponding layers of the first embodiment. It should be noted that according to the present embodiment, the barrier layer 153 may be omitted.

A p-type diffusion layer region 156, corresponding to an impurity region of a second conductive type, is formed in the InP window layer 155 such that it reaches the wavelength selection/absorption layer 154. Further, a nonreflective film 157, also acting as a surface protective film, is formed on the InP window layer 155. The nonreflective film 157 may be formed of, for example, an SiN film.

It should be noted that according to the present embodiment, an n-type InP layer, corresponding to the semiconductor layer of the first conductive type, may be formed on an insulative substrate, and then the above transmitted light absorption/recombination layer 152, barrier layer 153, wavelength selection/absorption layer 154, and undoped InP window layer 155 may be formed over the n-type InP layer.

Still referring to FIG. 10, a cathode electrode 158 is a first electrode for energizing the n-type InP substrate 151, while an anode electrode 159 is a second electrode for energizing the p-type diffusion layer region 156.

Light with a wavelength of 1.3 µm entering the portion of the nonreflective film 157 not covered by the anode electrode 159, as shown at the top of the figure, goes through the InP window layer 155 since the bandgap wavelength of the InP window layer 155 is 0.92 µm, and reaches the wavelength selection/absorption layer 154. The wavelength selection/absorption layer 154 has a bandgap wavelength of 1.4 µm, which is longer than the wavelength of the incident light (1.3 µm). Therefore, the 1.3 µm wavelength light is absorbed by the wavelength selection/absorption layer 154 and then drawn from the device as an electric current signal.

Light with a wavelength of 1.55 µm also goes through the InP window layer 155 and reaches the wavelength selection/ absorption layer 154. However, since the bandgap wavelength of the wavelength selection/absorption layer 154 is shorter than 1.55 μm, the light transmits through the wavelength selection/absorption layer 154 and reaches the transmitted light absorption/recombination layer 152 through the barrier layer 153. Since the bandgap wavelength of the transmitted light absorption/recombination layer 152 is longer than 1.55 μm, the 1.55 μm wavelength light is absorbed by the transmitted light absorption/recombination layer 152, generating electrons and holes. These generated electrons and holes then recombine with each other within this layer and hence disappear.

Thus, like the APD of the first embodiment, the PD of the present embodiment includes a wavelength selection/absorption layer and a transmitted light absorption/recombination layer, which allows the 1.3 μm wavelength light to be selectively drawn from the device, as an electric current, while preventing the 1.55 μm wavelength light from being drawn.

It should be noted that the PD of the present embodiment may also be configured such that a multilayered reflective layer for reflecting light at wavelengths longer than the bandgap wavelength of the wavelength selection/absorption layer is formed on or in the window layer. In this case, the multilayered reflective layer may be made of p-type semiconductor.

It should be further noted that the present invention is not limited to the embodiments described above, and various alterations may be made thereto without departing from the spirit and scope of the invention.

The features and advantages of the present invention may be summarized as follows.

The semiconductor photodetector devices of the present invention can selectively receive the shorter wavelength light without using a wavelength filter.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2005-070646, filed on Mar. 14, 2005 including specification, claims, drawings and summary, on which the Convention priority of the present application is based, are incorporated herein by reference in its entirety.

What is claimed is:

1. A semiconductor photodetector device comprising:
   an n-type first semiconductor layer;
   a first absorption layer having a bandgap energy;
   a second semiconductor layer having a bandgap energy larger than the bandgap energy of said first absorption layer and including a p-type doped region located at a surface of said second semiconductor layer;
   a second absorption layer located between said first semiconductor layer and said first absorption layer;
   an electric field reduction layer located between said first absorption layer and said second absorption layer; and
   a multiplication layer located between said first absorption layer and said second absorption layer, wherein
     said first semiconductor layer, said second absorption layer, said multiplication layer, said electric field reduction layer, said first absorption layer, and said second semiconductor layer are arranged from bottom to top, in that order, in a laminated structure, so that said second semiconductor layer is separated from said multiplication layer by at least said first absorption layer, and said second absorption layer, in response to incident light, injects electrons into said multiplication layer, and
     said semiconductor photodetector device detects light incident on the surface of said second semiconductor layer.

2. The semiconductor photodetector device according to claim 1, wherein said multiplication layer includes an AlInAs layer.

3. The semiconductor photodetector according to claim 1, wherein said second semiconductor layer and said doped region are free of any guard ring structure.

4. The semiconductor photodetector device according to claim 3, wherein said multiplication layer includes an AlInAs layer.

* * * * *